United States Patent [19]
Duret et al.

[11] Patent Number: 5,418,485
[45] Date of Patent: May 23, 1995

[54] CLOCK SIGNAL CONDITIONING CIRCUIT

[75] Inventors: Alain Duret, Saint Pierre, France; Eric Boulian, Grand-Lancy; Anil Gercekci, Geneva, both of Switzerland

[73] Assignee: Motorola, Inc., Schaumburg, Ill.

[21] Appl. No.: 170,101

[22] Filed: Dec. 20, 1993

[30] Foreign Application Priority Data

Dec. 22, 1992 [GB] United Kingdom ............... 9226695

[51] Int. Cl.⁶ .......................................... H03K 3/017
[52] U.S. Cl. .................................. 327/172; 327/100; 327/58; 327/227
[58] Field of Search .......................... 307/265–269, 307/273, 351; 328/63, 34, 58, 61

[56] References Cited

U.S. PATENT DOCUMENTS

| | | | |
|---|---|---|---|
| 3,693,028 | 9/1972 | Fussell | 307/351 |
| 3,921,081 | 11/1975 | Lane | 307/265 |
| 3,942,042 | 3/1976 | Nikami | 307/247.1 |
| 3,965,431 | 6/1976 | Johnson | 307/265 |
| 4,588,905 | 5/1986 | Kojima | 307/268 |
| 4,606,053 | 8/1986 | Schröder | 328/63 |
| 4,635,280 | 1/1987 | Smith et al. | 328/155 |
| 4,937,468 | 6/1990 | Shekhawat et al. | 307/273 |
| 5,003,196 | 3/1991 | Kawaguchi | 307/290 |

FOREIGN PATENT DOCUMENTS

| | | | |
|---|---|---|---|
| 1408116 | 10/1975 | United Kingdom | H03K 5/01 |
| 2187005 | 8/1987 | United Kingdom | H03K 5/01 |

*Primary Examiner*—Timothy P. Callahan
*Assistant Examiner*—T. Lam
*Attorney, Agent, or Firm*—Rennie William Dover

[57] ABSTRACT

A clock signal conditioning circuit (100) for use in a smart card (102) has an input node (112) for receiving an applied clock signal, an output node (126) for producing a conditioned clock signal, a rising/falling edge detector (118) for detecting edges in the received clock signal, a bistable device (122) for forming at the output node a clock signal in response to the edge detector, and a timer (120, 124) for inhibiting switching of the bistable device for a predetermined time (T) following detection by the edge detector of an edge. Such a clock signal conditioning circuit provides a conditioned clock signal which is substantially independent of variations in the duty cycle of the applied clock signal and is substantially immune to glitches in the applied clock signal.

7 Claims, 6 Drawing Sheets

5,418,485

CLOCK SIGNAL CONDITIONING CIRCUIT

BACKGROUND OF THE INVENTION

This invention relates to a clock signal conditioning circuit, and particularly, although not exclusively, to a clock signal conditioning circuit for use in a "smart card".

The term "smart card" is commonly used to refer to a portable, credit-card size card containing an integrated circuit having a central processing unit (CPU), input and output terminals and memory. Such cards have no on-card power supply and rely on the application of external power and clock signals in order to actively function. The clock signal applied externally to such a card must be a periodic signal with a frequency greater than a minimum frequency $f_{min}$ and less than a maximum frequency $f_{max}$.

Under some conditions the duty cycle of the externally applied clock signal may vary, and parasitic effects may cause random transients (glitches) in the externally applied clock signal. The result of such duty cycle variation and/or glitches in the externally applied clock signal may be that the application program being run by the CPU does not execute properly, causing uncontrolled mis-functioning of the smart card.

SUMMARY OF THE INVENTION

In accordance with the invention there is provided a clock signal conditioning circuit comprising:
 an input node for receiving an applied clock signal;
 an output node for producing thereat a conditioned clock signal;
 edge detector means for detecting edges in the received clock signal;
 bistable means for forming at the output node a clock signal in response to the edge detector means; and
 timer means for inhibiting switching of the bistable means for a predetermined time following detection by the edge detector means of an edge.

Such a clock signal conditioning circuit thus provides a conditioned clock signal which is substantially immune to glitches in the applied clock signal and which can be substantially independent of variations in the duty cycle of the applied clock signal.

BRIEF DESCRIPTION OF THE DRAWINGS

Five clock signal conditioning circuits in accordance with the present invention will now be described, by way of example only, with reference to the accompanying drawings, in which.

DESCRIPTION OF THE PREFERRED EMBODIMENT

Figure 1:
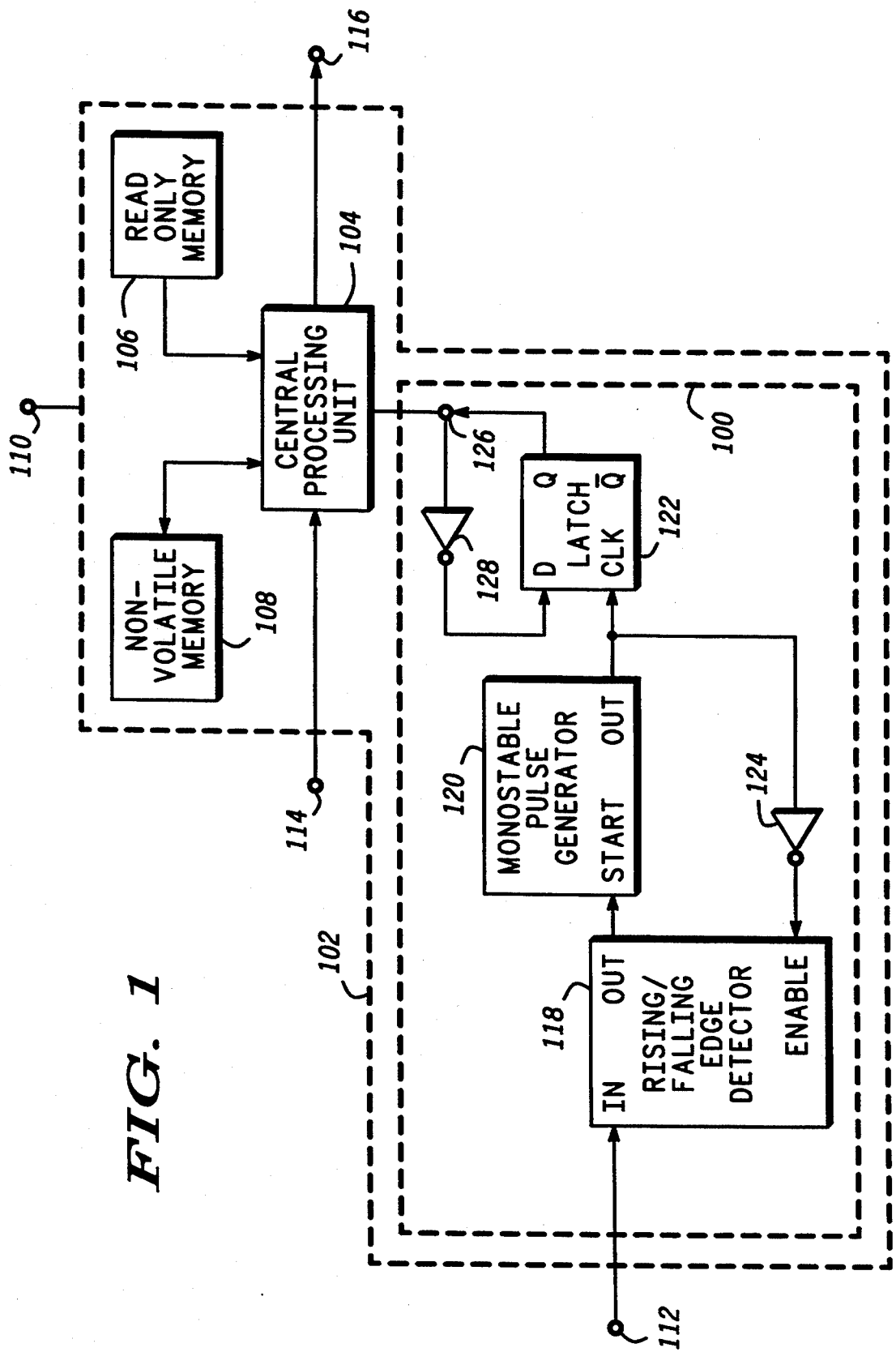
FIG. 1 shows a block-schematic circuit diagram of a first clock signal conditioning circuit.

Referring now to FIG. 1, a clock signal conditioning circuit 100 is built into a smart card 102. The smart card 102 includes a central processing unit 104, read only memory (ROM) 106, non-volatile memory (NVM) 108, a power input terminal 110, a clock input terminal 112, a data input terminal 114 and a data output terminal 116.

The clock signal conditioning circuit 100 has a rising-/falling edge detector 118 which is connected to the clock input terminal 112 and which detects positive and negative polarity edges of pulses in a periodic clock signal applied at the clock input terminal 112. An output of the edge detector 118 is connected to an input of a monostable pulse generator 120 (having a time constant T). The monostable 120 has its output connected to the clock input of a flip-flop or latch 122. The output of the monostable 120 is also connected, via an inverter 124, to an enable input of the edge detector 118. The flip-flop 122 has its non-inverting output connected to a clock output terminal 126, which is connected to the smart card's central processing unit 104. The flip-flop 122 also has its non-inverting output connected, via an inverter 128, to its data input.

The clock-conditioning circuit of FIG. 1 represents a minimum-component embodiment which may be used where the "mark" and "space" phases of the clock signal are equal. The edge detector 118 is normally enabled, and when it detects a rising or falling edge in the clock signal input at node 112, it produces an output signal to the monostable 120. When the monostable receives the output signal from the edge detector 118, the monostable produces an output pulse having a duration T, which is somewhat less than the mark and space periods of the clock signal. The monostable output pulse is applied to the clock input of the flip-flop 122. The monostable output pulse is also applied, via the inverter 124, to the enable input of the edge detector 118.

Thus, after producing an output signal upon detection of a rising or falling edge in the clock signal, the edge detector 118 is disabled for a time T. The edge detector 118 becomes re-enabled at the end of the time T, and is then ready to detect the next edge of the clock signal. The detection of this next edge again initiates triggering of the monostable 120 causing flip-flop 122 to be toggled and causing the edge detector 118 to be again disabled for a time T.

Therefore, if a transition occurs on the input clock signal while the edge detector 118 is disabled, it is ignored and the flip-flop 122 is not toggled (it will be toggled on the next transition on the input clock signal detected after the time T has elapsed). In this way, spikes and short pulses on the input clock signal are "swallowed" (i.e. they are not transferred through to the output clock signal), allowing the flip-flop output to produce a conditioned clock signal which may be in phase or out of phase with the input clock signal.

Figure 6:
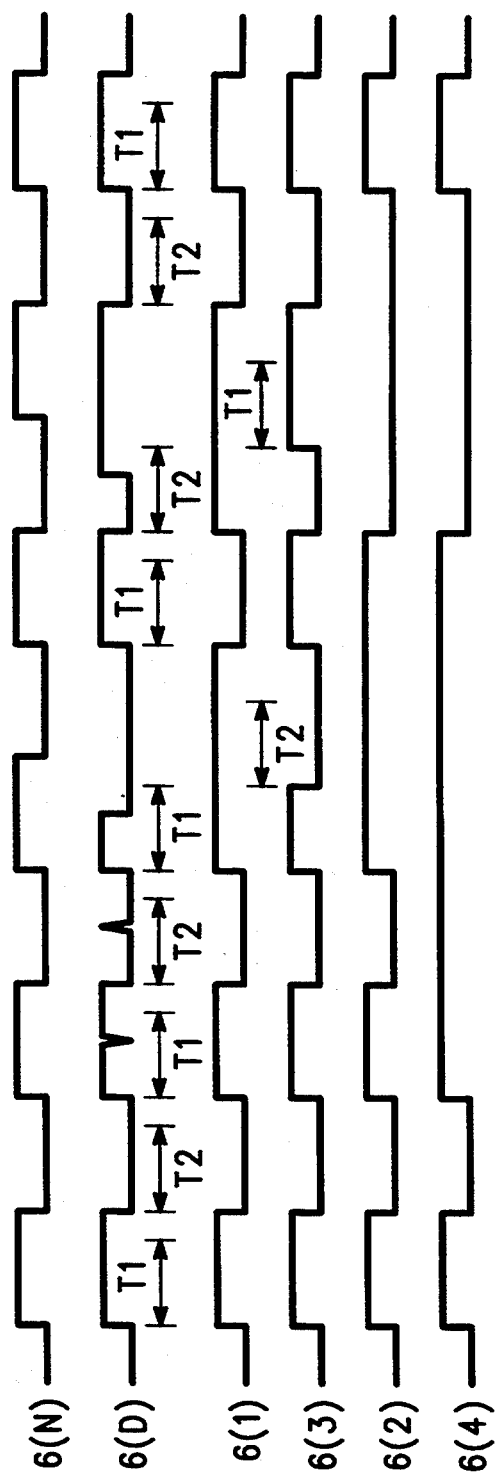
FIG. 6 shows graphical representations of waveforms occurring at certain points in the circuits of FIGS. 1-4.

Thus, it will be appreciated that the when fed with an input clock signal as shown in disturbed form in FIG. 6(D), the clock-conditioning circuit 100 of FIG. 1 produces a conditioned output clock signal as shown in FIG. 6(1), which is different from the nominal form as shown in FIG. 6(N).

Figure 2:
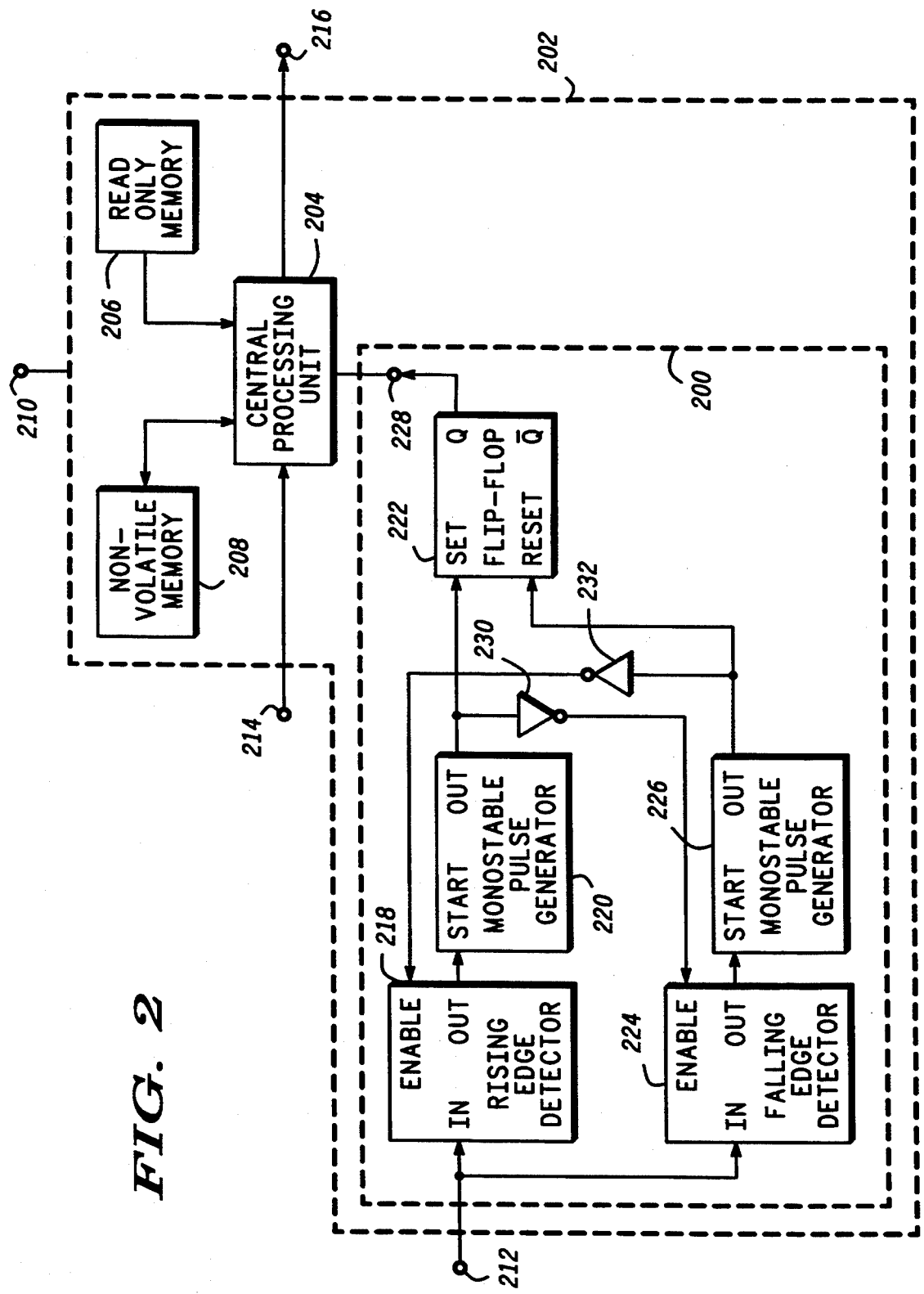
FIG. 2 shows a block-schematic circuit diagram of a second clock signal conditioning circuit.

Referring now to FIG. 2, a clock signal conditioning circuit 200 is built into a smart card 202. The smart card 202 includes a central processing unit 204, read only memory (ROM) 206, non-volatile memory (NVM) 208, a power input terminal 210, a clock input terminal 212, a data input terminal 214 and a data output terminal 216.

The clock signal conditioning circuit 200 has a rising edge detector 218 which is connected to the clock input terminal 212 and which detects positive polarity edges of pulses in a periodic clock signal applied at the clock input terminal 212. An output of the edge detector 218 is connected to a monostable pulse generator 220 (having a time constant $T_1$). The monostable 220 has its output connected to the SET input of a flip-flop 222. The clock signal conditioning circuit 200 also has a falling edge detector 224 which is connected to the clock input terminal 212 and which detects negative polarity edges of pulses in a periodic clock signal applied at the clock input terminal 212. An output of the edge detector 224 is connected to a monostable pulse generator 226 (having a time constant $T_2$). The monostable 226 has its output connected to the RESET input of the flip-flop 222. The non-inverting output of the flip-flop 222 is connected to a clock output terminal 228.

The output of the monostable 220 is also connected, via an inverter 230, to an enable input of the edge detector 224. The output of the monostable 226 is also connected, via an inverter 232, to an enable input of the edge detector 218.

The clock-conditioning circuit of FIG. 2 represents a low-component-count embodiment which may be used where the "mark" and "space" phases of the clock signal are not necessarily equal. The time $T_1$ is chosen to be somewhat less than the "mark" period of the input clock signal, and the time $T_2$ is chosen to be somewhat less than the input clock signal's "space" period. The edge detectors 218 and 224 are normally enabled.

when the edge detector 218 detects a rising edge in the clock signal input at node 212, it produces an output signal to the monostable 220. When the monostable receives the output signal from the edge detector 218, the monostable produces an output pulse having a duration $T_1$. The monostable output pulse is applied to the SET input of the flip-flop 222, forcing the output clock high. The monostable output pulse is also applied, via the inverter 230, to the enable input of the edge detector 224.

Similarly, when the edge detector 224 detects a falling edge in the clock signal input at node 212, it produces an output signal to the monostable 226. When the monostable receives the output signal from the edge detector 224, the monostable produces an output pulse having a duration $T_2$. The monostable output pulse is applied to the RESET input of the flip-flop 222, forcing the output clock low. The monostable output pulse is also applied, via the inverter 232, to the enable input of the edge detector 218.

However, if, after a rising edge has been detected in the input clock signal and the monostable 220 has begun to produce its output pulse with time constant $T_1$, a falling edge in the clock signal input at node 212 occurs before the time constant $T_1$ has elapsed, the edge detector 224 will not detect the falling edge because it will be disabled by the output pulse applied from the monostable 220 via the inverter 230. In this way, a falling edge in the clock signal input at node 212 will not cause the output clock to go low.

Similarly, if, after a falling edge has been detected in the input clock signal and the monostable 226 has begun to produce its output pulse with time constant $T_2$, a rising edge in the clock signal input at node 212 occurs before the time constant $T_2$ has elapsed, the edge detector 218 will not detect the rising edge because it will be disabled by the output pulse applied from the monostable 226 via the inverter 232. In this way, a rising edge in the clock signal input at node 212 will not cause the output clock to go high.

Thus, glitches as well as short pulses on the input clock signal are ignored, allowing the flip-flop output to produce a conditioned clock signal which is forced to stay in phase with the input clock signal.

Thus, it will be appreciated that when fed with an input clock signal as shown in disturbed form in FIG. 6(D), the clock-conditioning circuit 200 of FIG. 2 produces a conditioned output clock signal as shown in FIG. 6(2), which is different from the nominal form as shown in FIG. 6(N).

Figure 3:
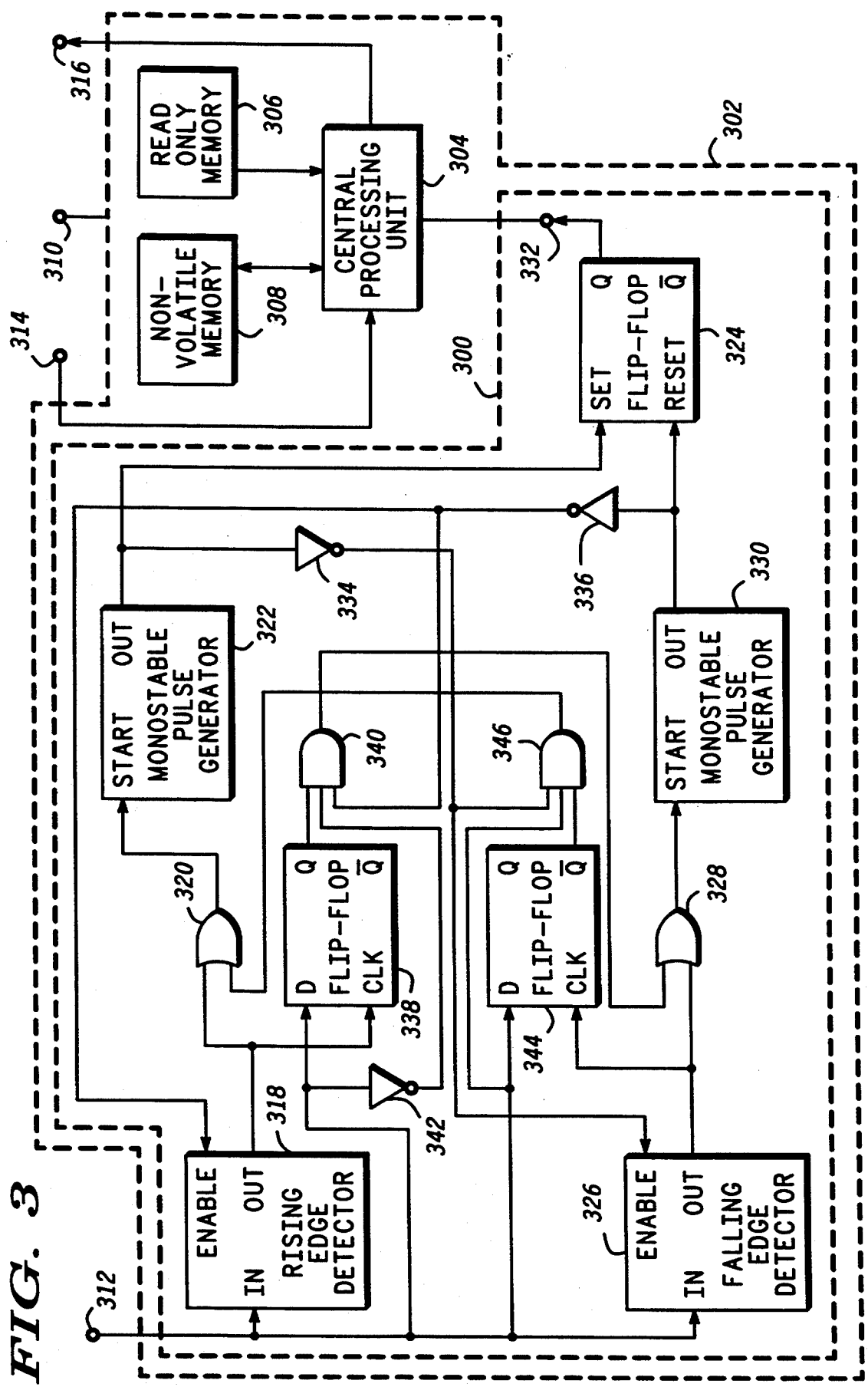
FIG. 3 shows a block-schematic circuit diagram of a third clock signal conditioning circuit.

Referring now to FIG. 3, a clock signal conditioning circuit 300 is built into a smart card 302. The smart card 302 includes a central processing unit 304, read only memory (ROM) 306, non-volatile memory (NVM) 308, a power input terminal 310, a clock input terminal 312, a data input terminal 314 and a data output terminal 316.

The clock signal conditioning circuit 300 has a rising edge detector 318 which is connected to the clock input terminal 312 and which detects positive polarity edges of pulses in a periodic clock signal applied at the clock input terminal 312. An output of the edge detector 318 is connected to an input of an OR gate 320, whose output is connected to a monostable pulse generator 322 (having a time constant $T_1$). The monostable 322 has its output connected to the SET input of a flip-flop 324. The clock signal conditioning circuit 300 also has a falling edge detector 326 which is connected to the clock input terminal 312 and which detects negative polarity edges of pulses in a periodic clock signal applied at the clock input terminal 312. An output of the edge detector 326 is connected to an input of an OR gate 328, whose output is connected to a monostable pulse generator 330 (having a time constant $T_2$). The monostable 330 has its output connected to the RESET input of the flip-flop 324. The non-inverting output of the flip-flop 324 is connected to a clock output terminal 332.

The output of the monostable 322 is also connected, via an inverter 334, to an enable input of the edge detector 326. The output of the monostable 330 is also connected, via an inverter 336, to an enable input of the edge detector 318.

The output of the edge detector 318 is also connected to a clock input of a flip-flop or latch 338, whose data input is connected to the clock input terminal 312. The flip-flop 338 has its non-inverting output connected to an input of an AND gate 340; another input of the AND gate 340 is connected to the inverted output of the monostable 330; and another input of the AND gate 340 is connected to clock input terminal 312 via an inverter 342. The output of the AND gate 340 is connected to an input of the OR gate 328.

The output of the edge detector 326 is also connected to a clock input of a flip-flop or latch 344, whose data input is connected to the clock input terminal 312. The flip-flop 344 has its inverting output connected to an input of an AND gate 346; another input of the AND gate 346 is connected to the inverted output of the monostable 322; and another input of the AND gate 346 is connected to clock input terminal 312. The output of the AND gate 346 is connected to an input of the OR gate 320.

It will be understood that the clock-conditioning circuit of FIG. 3 represents an extension of the already-described clock-conditioning circuit 200 of FIG. 2, in which the following additional components are connected: flip-flops 338 & 344, AND gates 340 & 346, OR gates 320 & 328 and inverter 342.

It will be appreciated that the circuit of FIG. 3 operates in a fundamentally similar manner to that described above with respect to the circuit of FIG. 2. However, the function of the additional components is as follows: just after a time constant (T1 or T2) has elapsed, status of the input clock logic level is checked. If the logic level of the input clock has changed since the beginning of the time constant, the output clock is toggled and the other time constant is started. Thus, the additional components serve to stretch short pulses in the input clock signal and to change the duty cycle of the output clock signal with respect to that of the input clock signal.

Thus, glitches on the input clock signal are ignored, but short pulses are stretched in order to produce a desired duty cycle in the output clock signal. It will be appreciated that in the clock-conditioning circuit of FIG. 3, if the input clock frequency does not exceed its maximum value of $(T_1+T_2)^{-1}$, the input and output clocks remain in phase.

Thus, it will be appreciated that when fed with an input clock signal as shown in disturbed form in FIG. 6(D), the clock-conditioning circuit 300 of FIG. 3 produces a conditioned output clock signal as shown in FIG. 6(3), which is very similar to the nominal form as shown in FIG. 6(N).

Figure 4:
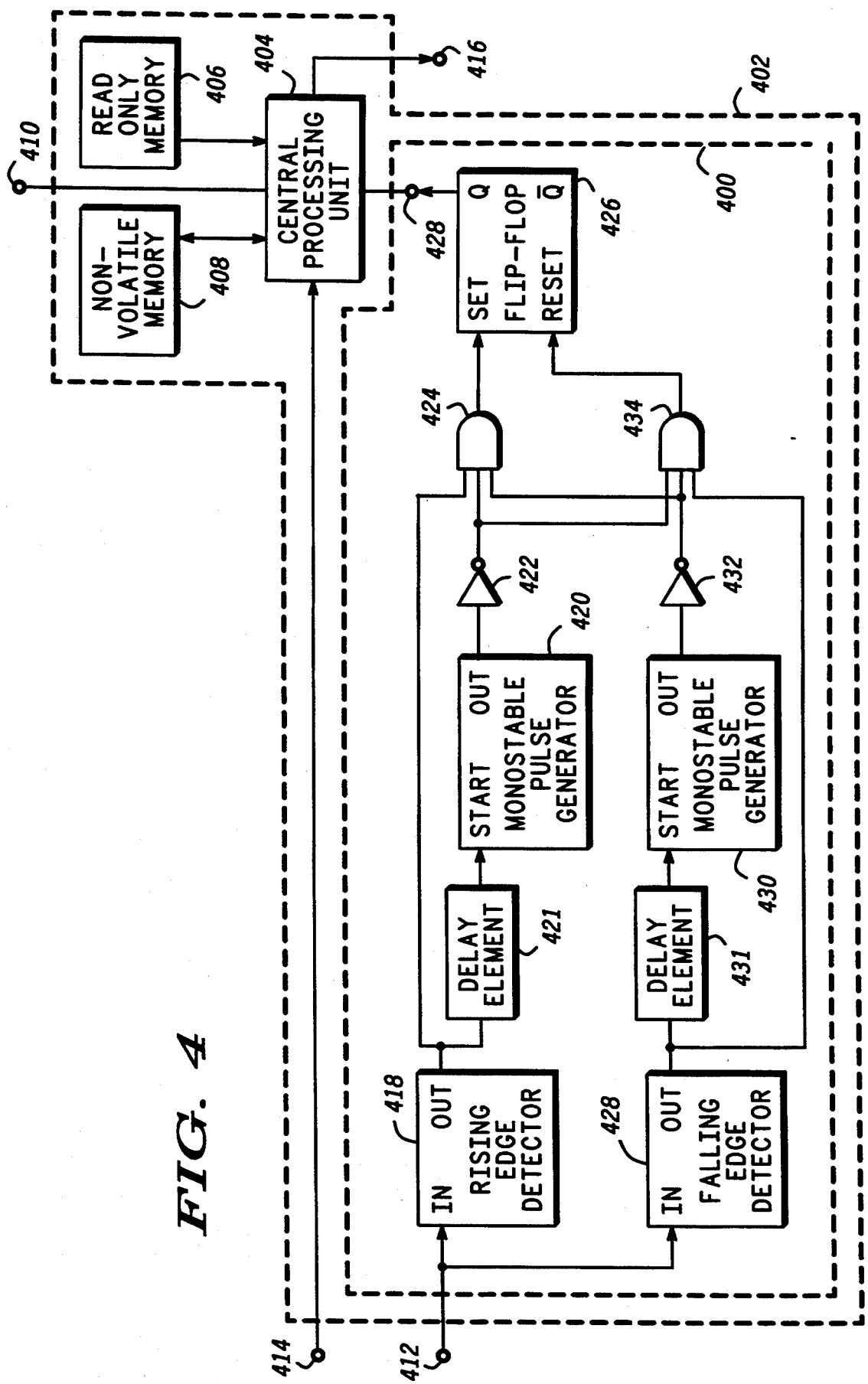
FIG. 4 shows a block-schematic circuit diagram of a fourth clock signal conditioning circuit.

Referring now to FIG. 4, a clock signal conditioning circuit 400 is built into a smart card 402. The smart card 402 includes a central processing unit 404, read only memory (ROM) 406, non-volatile memory (NVM) 408, a power input terminal 410, a clock input terminal 412, a data input terminal 414 and a data output terminal 416.

The clock signal conditioning circuit 400 has a rising edge detector 418 which is connected to the clock input terminal 412 and which detects positive polarity edges of pulses in a periodic clock signal applied at the clock input terminal 412. An output of the edge detector 418 is connected to a monostable pulse generator 420 (having a time constant $T_1$) via a delay element 421. The monostable 420 has its output connected via an inverter 422 to an input of an AND gate 424. The output of the AND gate 424 is connected to the SET input of a flip-flop 426. The clock signal conditioning circuit 400 also has a falling edge detector 428 which is connected to the clock input terminal 412 and which detects negative polarity edges of pulses in a periodic clock signal applied at the clock input terminal 412. An output of the edge detector 428 is connected to a monostable pulse generator 430 (having a time constant $T_2$) via a delay element 431. The monostable 430 has its output connected via an inverter 432 to an input of an AND gate 434. The output of the AND gate 434 is connected to the RESET input of the flip-flop 426. The non-inverting output of the flip-flop 426 is connected to a clock output terminal 428.

The AND gate 424 also has an input connected to the output of the edge detector 418, and further has an input connected to the inverted output of the monostable 430. The AND gate 434 also has an input connected to the output of the edge detector 428, and further has an input connected to the inverted output of the monostable 420.

The clock-conditioning circuit of FIG. 4 represents a low-component-count embodiment which may be used where the "mark" and "space" phases of the clock signal are not necessarily equal. The time $T_1$ is chosen to be somewhat less than the "mark" period of the input clock signal, and the time $T_2$ is chosen to be somewhat less than the input clock signal's "space" period. The edge detectors 418 and 428 are normally enabled.

When the edge detector 418 detects a rising edge in the clock signal input at node 412, it produces a delayed output signal to the monostable 420 and directly to the AND gate 424 which (assuming that the monostable 430 is not producing its output pulse) immediately produces an output pulse which is applied to the SET input of the flip-flop 426, forcing the output clock high. When the monostable 420 receives the output signal from the edge detector 418, the monostable produces an output pulse having a duration $T_1$. The monostable output pulse is applied to AND gate 424 via the inverter 422, forcing the output of the AND gate 424 low until the time constant $T_1$ has expired. The output pulse from monostable 420 is also applied to AND gate 434 via the inverter 422, so also forcing the output of the AND gate 434 low until the time constant $T_1$ has expired.

Similarly, when the edge detector 428 detects a falling edge in the clock signal input at node 412, it produces a delayed output signal to the monostable 430 and directly to the AND gate 434 which (assuming that the monostable 420 is not producing its output pulse) immediately produces an output pulse which is applied to the RESET input of the flip-flop 426, forcing the output clock low. When the monostable 430 receives the output signal from the edge detector 428, the monostable produces an output pulse having a duration $T_2$. The monostable output pulse is applied to AND gate 434 via the inverter 432, forcing the output of the AND gate 434 low until the time constant $T_2$ has expired. The output pulse from monostable 430 is also applied to AND gate 434 via the inverter 432, so also forcing the output of the AND gate 424 low until the time constant $T_2$ has expired.

Thus, the output clock is toggled high or low only when a rising edge or falling edge respectively is detected and neither monostable 420 nor 430 is producing its output pulse. The output clock cannot toggle while one (or both) of the monostables is producing its output.

Any rising or falling transition which occurs on the input clock signal while the monostable 420 or 430 respectively is running causes that monostable to be re-triggered without toggling the output clock.

The output clock is kept idle (not toggled) as long as the input clock frequency exceeds $(T_1+T_2)^{-1}$.

Thus, it will be appreciated that when fed with an input clock signal as shown in disturbed form in FIG. 6(D), the clock-conditioning circuit 400 of FIG. 4 produces a conditioned output clock signal as shown in FIG. 6(4), which is different from the nominal form as shown in FIG. 6(N).

Figure 5:
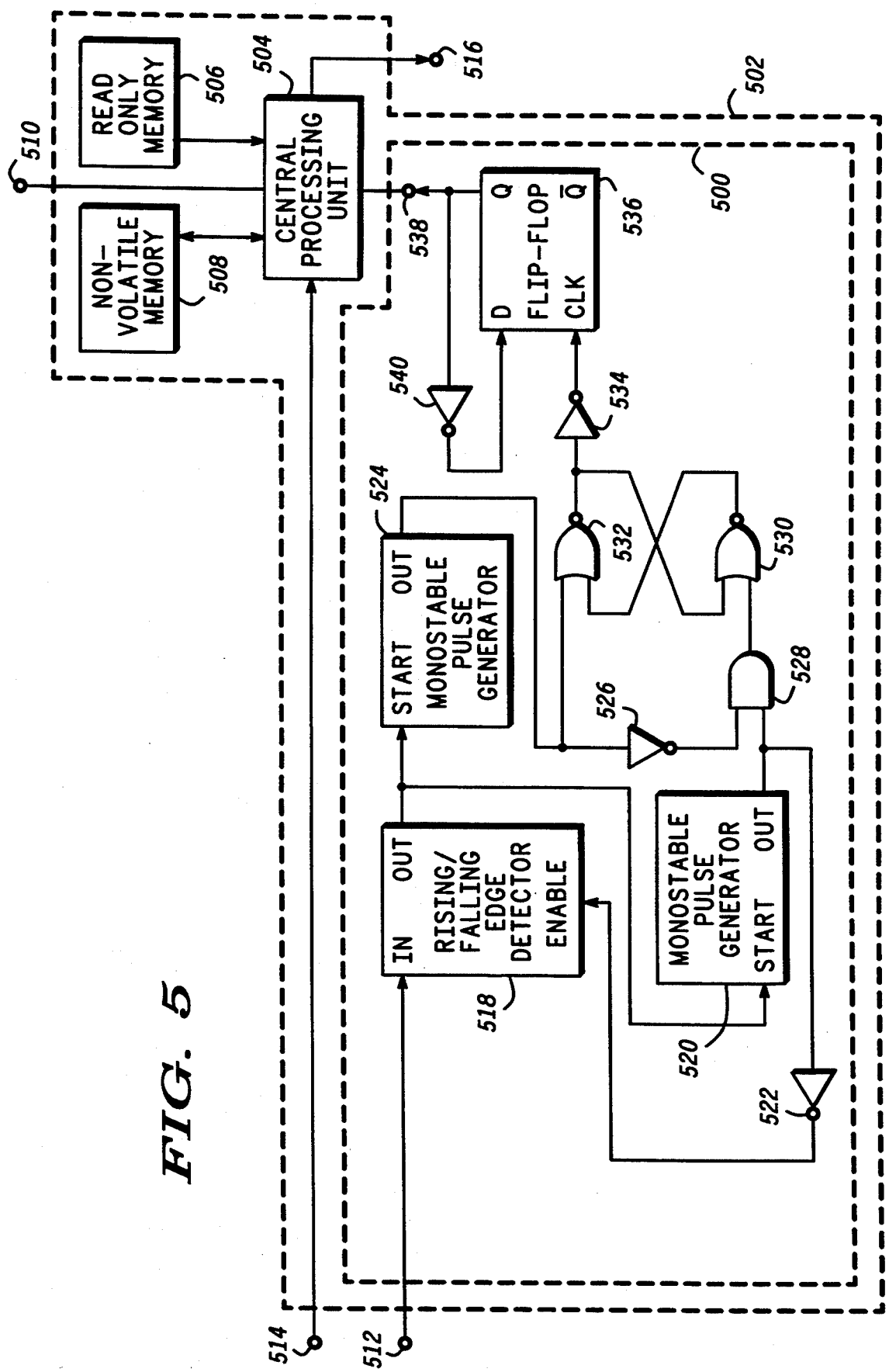
FIG. 5 shows a block-schematic circuit diagram of a fifth clock signal conditioning circuit.

Referring now to FIG. 5, a clock signal conditioning circuit 500 is built into a smart card 502. The smart card 502 includes a central processing unit 504, read only memory (ROM) 506, non-volatile memory (NVM) 508, a power input terminal 510, a clock input terminal 512, a data input terminal 514 and a data output terminal 516.

The clock signal conditioning circuit 500 has a rising-/falling edge detector 518 which is connected to the clock input terminal 512 and which detects positive and negative polarity edges of pulses in a periodic clock signal applied at the clock input terminal 512. An output of the edge detector 518 is connected to an input of a monostable pulse generator 520. The monostable 520 has its output connected via an inverter 522, to an enable input of the edge detector 518.

The clock signal conditioning circuit 500 also has a monostable pulse generator 524, whose input is connected to the output of the edge detector 518. The output of monostable 524 is connected, via an inverter 526, to an input of an AND gate 528. Another input of the AND gate 528 is connected to the output of the monostable 520. The output of the AND gate 528 is connected to an input of a NOR gate 530. Another NOR gate 532 has an input connected to the output of the monostable 524. The output of the NOR gate 532 is connected to another input of the NOR gate 530, and the output of the NOR gate 530 is connected to another input of the NOR gate 532.

The output of the NOR gate 532 is also connected, via an inverter 534, to the clock input of a flip-flop or latch 536. The flip-flop 536 has its non-inverting output connected to a clock output terminal 538, which is connected to the smart card's central processing unit 504. The flip-flop 536 also has its non-inverting output connected, via an inverter 540, to its data input.

It will be understood that the clock-conditioning circuit 500 of FIG. 5 represents an extension of the already-described clock-conditioning circuit 100 of FIG. 1, in which the following additional components are connected: monostable 524, inverter 526, AND gate 528, NOR gates 530 & 532 and inverter 534. Like the clock-conditioning circuit 100 of FIG. 1 described above, the clock-conditioning circuit 500 of FIG. 5 represents a minimum-component embodiment which may be used where the "mark" and "space" phases of the clock signal are equal. As will be explained below, in the circuit of FIG. 5 two time constants ($T_H$ and $T_L$) are used to generate an intermediate clock signal which is twice the frequency of the input clock signal.

The edge detector 518 is normally enabled, and when it detects a rising or falling edge in the clock signal input at node 512, it produces an output signal to the monostable 520. When the monostable receives the output signal from the edge detector 518, the monostable produces an output pulse having a duration $T_H$. The output signal from the edge detector 518 is also applied to the monostable 524, causing it to produce an output pulse having a duration $T_L$. The output pulse from monostable 524 is applied to the AND gate 528 via the inverter 526. The output pulse from monostable 520 is applied to the AND gate 528. The output pulse from monostable 520 is also applied, via the inverter 522, to the enable input of the edge detector 518. Thus, after producing an output signal upon detection of a rising or falling edge in the clock signal, the edge detector 518 is disabled for a time $T_H$. Thus, like the clock-conditioning circuit 100 of FIG. 1 described above, the clock-conditioning circuit 500 of FIG. 5 is immune to spikes and short pulses on the input clock signal.

The time constant $T_L$ is chosen to be less than the time constant $T_H$. Thus, when both monostables 520 and 524 are producing their output pulses (which they begin at the same time in response to the same output signal from the edge detector 518) the output of the AND gate 528 (whose input from the monostable 524 is inverted by inverter 526) is held low. However, since time constant $T_L$ is less than time constant $T_H$, the monostable 524 stops producing its output pulse before the monostable 520; at this point (after a time $T_L$ following the detected edge) the output of the AND gate 528 goes high. When (after a time $T_H$ following the detected edge) the monostable 520 stops producing its output pulse, the output of the AND gate goes low. Thus, the output of the AND gate 528 has a frequency twice that of the input clock signal It will be appreciated that the cross-coupled NOR gates 530 & 532 and the inverter 534 together form a glitch cancellation circuit, and the flip-flop 536 functions as a divide-by-two circuit to produce an output clock signal at terminal 538 having the same frequency as the input clock signal at terminal 512.

Thus, it will be appreciated that when fed with an input clock signal as shown in disturbed form in FIG. 6(D), the clock-conditioning circuit 500 of FIG. 5 produces a conditioned output clock signal as shown in FIG. 6(1), which is different from the nominal form as shown in FIG. 6(N).

It will be appreciated that although the above embodiments have been described as operating entirely with hardware components, some of the functions may, if desired, be alternatively performed in software.

It will be appreciated that various other modifications or alternatives to the above described embodiments will be apparent to a person skilled in the art without departing from the inventive concept.

We claim:

1. A clock signal conditioning circuit, comprising:
   an input node for receiving an applied clock signal;
   an output node for producing thereat a conditioned clock signal;
   edge detector means for detecting edges in the applied clock signal, wherein the edge detector means comprises a first edge detector for detecting an edge of a first polarity, and a second edge detector for detecting an edge of a second polarity opposite to the first polarity;
   bistable means for forming at the output node a clock signal in response to the edge detector means; and
   timer means for inhibiting switching of the bistable means for a predetermined time following detection by the edge detector means of an edge, wherein the timer means comprises a first monostable pulse generator arranged to be triggered in response to the first edge detector and having an output coupled to disable the second edge detector, and a second monostable pulse generator arranged to be triggered in response to the second edge detector and having an output coupled to disable the first edge detector.

2. A clock signal conditioning circuit according to claim 1 further comprising pulse stretching means coupled to the edge detector means for stretching pulses of the conditioned clock signal.

3. A clock signal conditioning circuit, comprising:
   an input node for receiving an applied clock signal;
   an output node for producing thereat a conditioned clock signal;
   edge detector means for detecting edges in the applied clock signal, wherein the edge detector means comprises a first edge detector for detecting an edge of a first polarity, and a second edge detector for detecting an edge of a second polarity opposite to the first polarity;
   bistable means for forming at the output node a clock signal in response to the edge detector means; and
   timer means for inhibiting switching of the bistable means for a predetermined time following detection by the edge detector means of an edge, wherein the timer means comprises:
   a first monostable pulse generator arranged to be triggered in response to the first edge detector;

a second monostable pulse generator arranged to be triggered in response to the second edge detector;

first logic means having inputs coupled to the output of the first edge detector and to the outputs of the first and second monostable pulse generators and having an output coupled to a first input of the bistable means; and second logic means having inputs coupled to the output of the second edge detector and to the outputs of the first and second monostable pulse generators and having an output coupled to a second input of the bistable means.

4. A clock signal conditioning circuit according to claim 3 arranged to produce a signal having a frequency which is an integer multiple of the applied clock signal frequency and comprising a frequency divider means coupled to receive the signal and to produce therefrom another signal having a desired frequency dependent on the frequency of the applied clock signal.

5. A clock signal conditioning circuit according to claim 1 wherein the bistable means comprises a data latch.

6. A clock signal conditioning circuit according to claim 1 wherein the bistable means comprises a flip-flop.

7. A clock signal conditioning circuit according to claim 1 arranged to produce a signal having a frequency which is an integer multiple of the applied clock signal frequency and comprising a frequency divider means coupled to receive the signal and to produce therefrom another signal having a desired frequency dependent on the frequency of the applied clock signal.

* * * * *